United States Patent
Miller

(10) Patent No.: US 6,556,881 B1
(45) Date of Patent: Apr. 29, 2003

(54) METHOD AND APPARATUS FOR INTEGRATING NEAR REAL-TIME FAULT DETECTION IN AN APC FRAMEWORK

(75) Inventor: Michael Lee Miller, Cedar Park, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/393,176

(22) Filed: Sep. 9, 1999

(51) Int. Cl.$^7$ .............................. G06F 19/00; G05B 9/02
(52) U.S. Cl. ..................... 700/108; 700/121; 700/80; 702/183
(58) Field of Search .................. 700/79, 80, 108–110, 700/121, 173, 174, 175, 177; 702/56, 35, 183–185, 84; 318/565; 340/680, 683

(56) References Cited

U.S. PATENT DOCUMENTS

| | | | |
|---|---|---|---|
| 3,819,916 A | * 6/1974 | Watanabe | 318/565 |
| 5,661,669 A | 8/1997 | Mozumder et al. | 364/552 |
| 5,740,062 A | 4/1998 | Berken et al. | 364/478.06 |
| 5,847,529 A | 12/1998 | Chao et al. | 318/568.21 |
| 5,859,964 A | 1/1999 | Wang et al. | 395/185.01 |
| 6,195,621 B1 | * 2/2001 | Bottomfield | 702/183 |
| 6,263,255 B1 | * 7/2001 | Tan et al. | 700/106 |

FOREIGN PATENT DOCUMENTS

WO  WO 99/16108  4/1999

* cited by examiner

Primary Examiner—Leo Picard
Assistant Examiner—Steven R. Garland
(74) Attorney, Agent, or Firm—Williams, Morgan & Amerson

(57) ABSTRACT

A method and apparatus for providing near real-time fault detection in a manufacturing process is provided. The apparatus includes a processing tool adapted to manufacture a processing piece and an interface, coupled to the processing tool, for receiving operational data from the processing tool related to the manufacture of the processing piece. In one embodiment, the processing tool is in the form of semiconductor fabrication equipment and the processing piece is a silicon wafer. A fault detection unit is provided to determine if a fault condition exists with the processing tool. An Advanced Process Control (APC) framework is further provided to receive the operational data from the first interface, and to send the data to the fault detection unit as the data is received by the first interface.

14 Claims, 4 Drawing Sheets

METHOD AND APPARATUS FOR INTEGRATING NEAR REAL-TIME FAULT DETECTION IN AN APC FRAMEWORK

BACKGROUND OF THE INVENTION

1. Field of the Invention

This invention relates generally to semiconductor fabrication technology, and, more particularly, to a method and apparatus for integrating near real-time fault detection capability into an Advanced Process Control (APC) framework.

2. Description of the Related Art

There is a constant drive in the semiconductor industry to increase the quality, reliability, and throughput of integrated circuit devices such as microprocessors, memory devices and the like. This drive is fueled by consumer demands for higher quality computers and electronic devices that operate more reliably.

These demands by the consumer have resulted in some improvements in the manufacture of semiconductor devices as well as in the manufacture of integrated circuit devices incorporating such semiconductor devices. Reducing the defects in the manufacture of these devices lowers the cost of the devices themselves. Accordingly, the cost of the final product incorporating these devices is also reduced, thus providing inherent monetary benefits to both the consumer and manufacturer.

Although there has been an improvement in detecting faults associated with semiconductor manufacturing processes, one problem currently plaguing the semiconductor manufacturing industry is the delay in reporting these faults such that corrective measures can be implemented in a more expedient manner. As a result of this delay, several faulty devices are produced, which undesirably increases costs for the manufacturer and consumer.

The present invention is directed to overcoming, or at least reducing the effects of, one or more of the problems set forth above.

SUMMARY OF THE INVENTION

In one aspect of the present invention, a method is provided for fault detection in a manufacturing process. The method comprises receiving operational data from a processing tool related to the manufacture of a processing piece at a first interface, sending the operational data from the first interface to a fault detection unit as the data is received by the first interface, and determining if a fault condition exists with the processing tool at the fault detection unit.

In another aspect of the present invention, a system is provided for fault detection in a manufacturing process. The system comprises a processing tool adapted to manufacture a processing piece. A first interface, coupled to the processing tool, is adapted to receive operational data from the processing tool related to the manufacture of the processing piece. A fault detection unit is provided to determine if a fault condition exists with the processing tool. The system further includes a framework adapted to receive the operational data from the first interface, and to send the data to the fault detection unit as the data is received by the first interface.

BRIEF DESCRIPTION OF THE DRAWINGS

The invention may be understood by reference to the following description taken in conjunction with the accompanying drawings, in which like reference numerals identify like elements, and in which.

Figure 1:
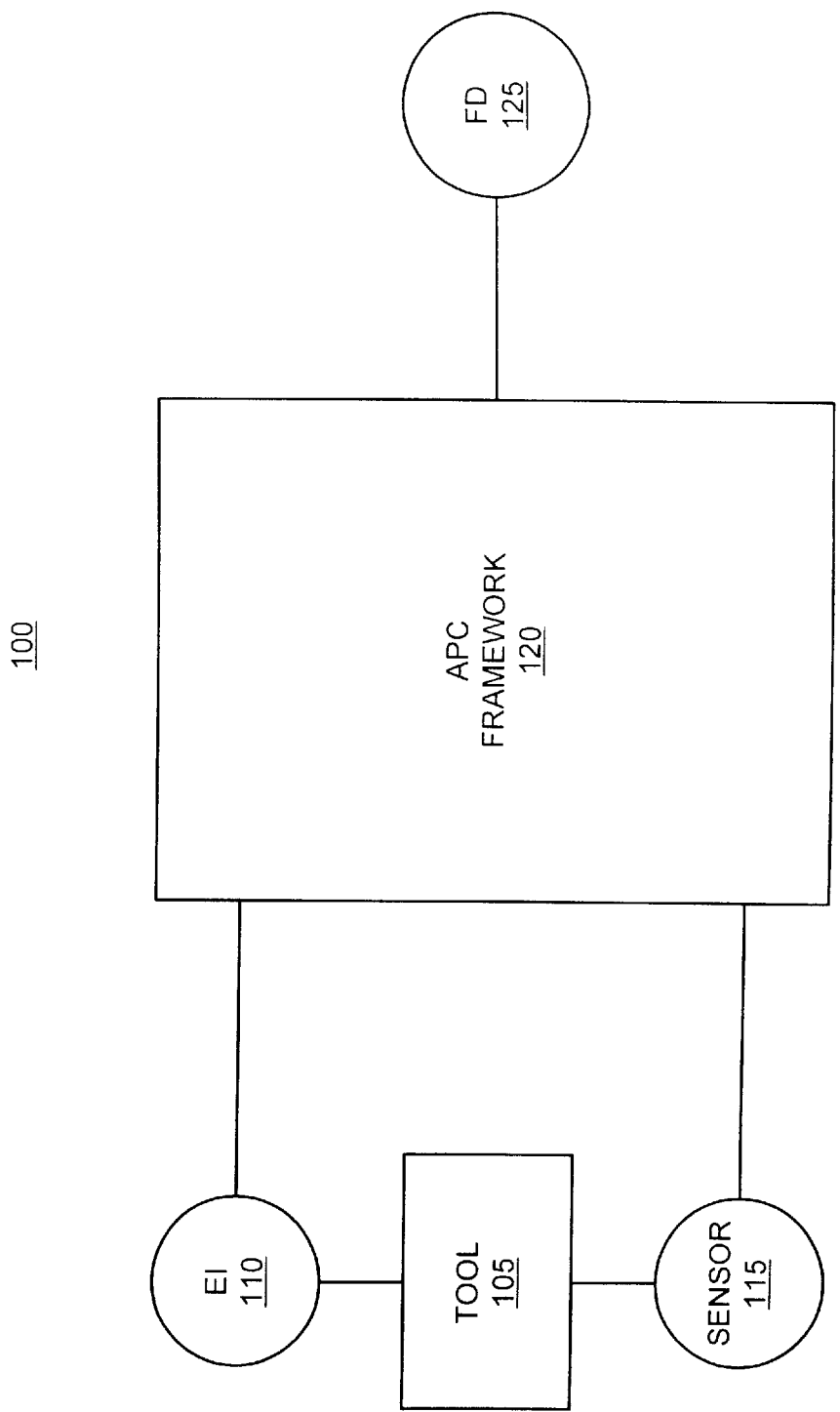
FIG. 1 illustrates a manufacturing system, including an APC framework, for providing near real-time fault detection of a processing tool in accordance with one embodiment.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Turning now to the drawings, and specifically referring to FIG. 1, a system 100 for providing near real-time fault detection in a semiconductor fabrication process is provided. The system 100 includes a processing tool 105, which in the illustrated embodiment, is in the form of semiconductor fabrication equipment used to produce a processing piece, such as a silicon wafer, for example. It will be appreciated, however, that the processing tool 105 need not necessarily be limited to the production of silicon wafers, but could include other types of manufacturing equipment for producing a variety of different types of commercial products without departing from the spirit and scope of the present invention.

The processing tool 105 is coupled to an equipment interface (EI) 110, which retrieves various operational data from the tool 105, and communicates this data to an Advanced Process Control (APC) framework 120 to determine whether the tool 105 is experiencing a faulty operation. The equipment interface 110 further may receive control signals from the APC framework 120 that could be used to control the tool 105. For example, the control signal from the APC framework 120 could be used to shut down the tool 105 if the operational data that was sent by the equipment interface 110 was deemed faulty by the APC framework 120.

An add-on sensor 115 could also be coupled to the tool 105 to measure additional operational data that is not ascertained by the tool 105 itself. For example, the add-on sensor 115 could be used to determine whether the silicon wafer was produced within acceptable operational limits by the tool 105. Such acceptable operational limits of the tool 105 may be to produce the wafer within a certain temperature range, for example. It will be appreciated, however, that the add-on sensor 115 may be used to record various other operational parameters, and, thus, need not be limited to the aforementioned example.

The sensor 115 may be embodied as a simple data acquisition program, such as a C++ standalone program acquiring data from a thermocouple wire, for example. Alternatively, the sensor 115 may be embodied as a full-fledged LABVIEW application, acquiring data through multiple transducers (not shown). It will further be appreciated that the sensor 115 need not be used at all, and the APC framework 120 could rely solely upon the operational data forwarded from the equipment interface 110. If used, however, the sensor 115 forwards the additional operational data to the APC framework 120 for analysis.

A fault detection (FD) unit 125, which is coupled to the APC framework 120, receives the operational data of the tool 105 from the equipment interface 110 and sensor 115 via the framework 120. Prior to sending the operational data to the fault detection unit 125, however, the APC framework 120 translates the operational data to a format that is recognizable to the fault detection unit 125 in a manner that is well known to those of ordinary skill in the art. In accordance with one embodiment, the fault detection unit 125 includes a commercially available software package, such as ModelWare, for example, that provides fault detection analysis of the processing tool 105. It will be appreciated, however, that other types of commercially available fault detection software could also be used in lieu thereof without departing from the spirit and scope of the present invention.

The fault detection unit 125 compares the received operational data from the APC framework 120 to fault model data. The fault model data includes operational data of other similar-type tools, where it was previously known that such tools have operated within acceptable operational limits. The types of faults that could be detected by the fault detection unit 125 include processing and/or operational faults in silicon wafer fabrication. Examples of processing faults may include, but are not necessarily limited to, non-optimal preheating of the chamber, catastrophic failure where a broken wafer is detected, abnormal N2 flow rate, temperature overshoots at the top of a ramp, tube temperature measurement drifts, etc. Some examples of operational faults detected by the fault detection unit 125 may include interrupted/resumed processing, no wafer sleuth or improper wafer sleuth prior to Rapid Thermal Anneal (RTA), etc.

The fault detection unit 125, upon evaluating the operational data sent from the APC framework 120, sends the results of potential faults and/or proper operation of the tool 105 to the APC framework 120. The APC framework 120, in turn, may send control signals to the equipment interface 110 to control the processing tool 105 based upon the results forwarded from the fault detection unit 125. For example, the control signal from the APC framework 120 may be to shut down the tool 105 to prevent any additional faulty production of wafers (providing this was determined by the fault detection unit 125). Data could also be sent from the APC framework 120 to inform a "fab" technician on how to rectify a faulty condition of the tool 105, if so desired.

Figure 2:
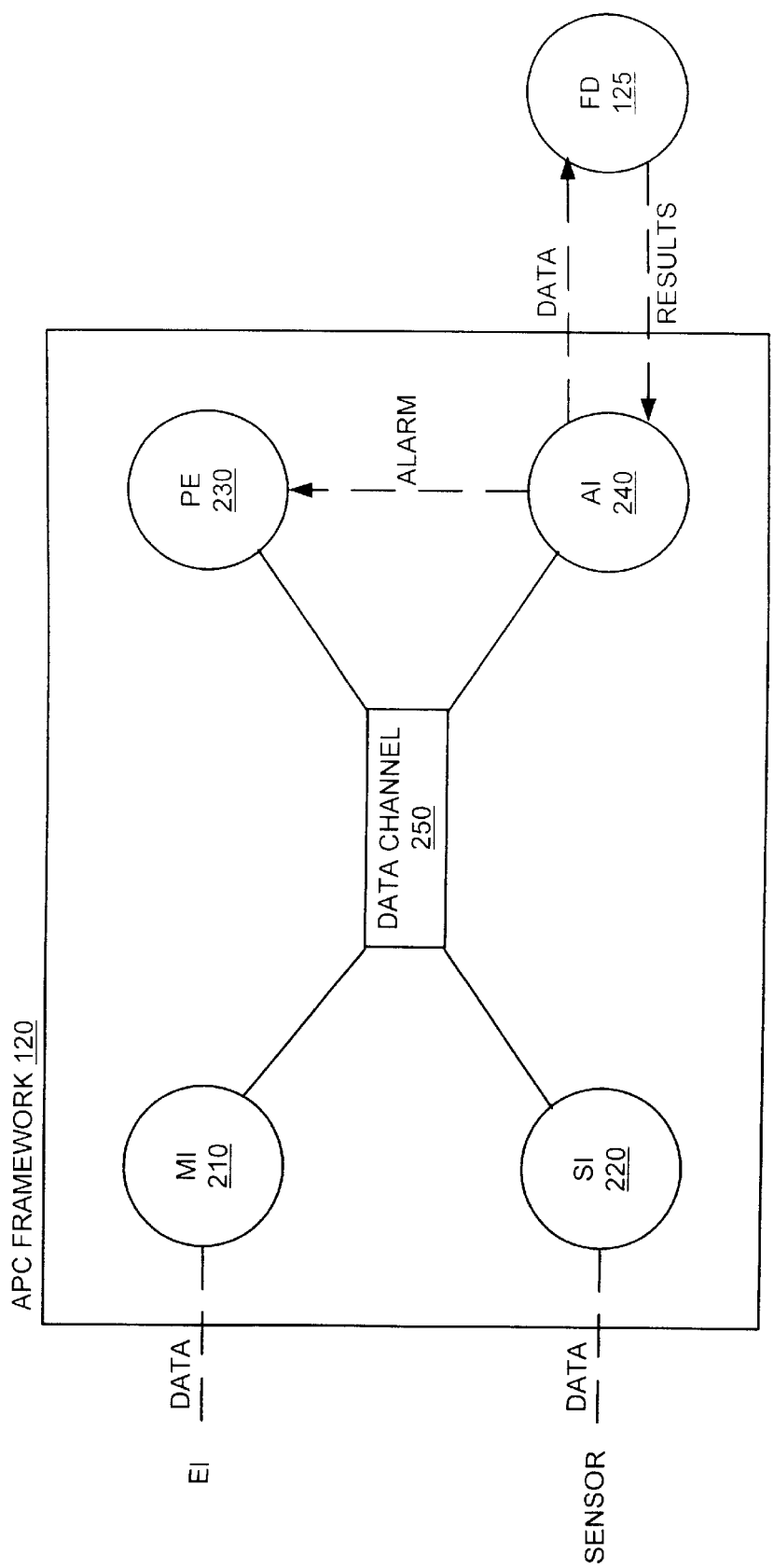
FIG. 2 depicts the detail of the APC framework of FIG. 1.

Turning now to FIG. 2, a more detailed representation of the APC framework 120 is provided. The APC framework 120 is a component-based architecture comprised of interchangeable, standardized software components enabling run-to-run control and fault detection of the processing tool 105. The APC framework 120 includes a machine interface (MI) 210 for communication with the tool 105 and the framework 120 to collect operational data therefrom. The APC framework 120 further includes a sensor interface (SI) 220 for communication between the add-on sensor 115 and the framework 120. The sensor interface 220 also collects operational data of the processing tool 105 through the sensor 115. A plan executor (PE) 230 (i.e., a process controller) manages the APC framework 120 and provides possible solutions to problems found with the operational data that was determined by the fault detection unit 125. The framework 120 further includes an applications interface (AI) 240 for interfacing with third-party applications that run on the fault detection unit 125 to analyze the operational data received via the machine and sensor interfaces 210, 220. In the illustrated embodiment, the third-party application is the fault detection unit 125. A data channel 250 is further provided to allow for communication of data from the machine and sensor interfaces 210, 220, to the plan executor 230, and the applications interface 240 of the APC framework 120.

The machine interface (MI) 210 couples to the equipment interface 110 to serve as an interface between the processing tool 105 and the APC framework 120. The machine interface 210 supports the setup, activation, monitoring, and data collection of the tool 105. The machine interface 210 receives commands, status events, and collected data from the equipment interface 110 and forwards this information to other components of the APC framework 120, namely the plan executor 230 and applications interface 240. Any responses that are received by the machine interface 210 from the other components of the APC framework 120 are routed to the equipment interface 110 for delivery to the processing tool 105. As previously discussed, this may include a control signal from the plan executor 230 to manipulate the tool 105 if a faulty condition is detected.

The machine interface 210 also reformats and restructures the messages between the specific communications protocol utilized by the equipment interface 110 and the Common Object Request Broker Architecture Interface Definition Language (CORBA IDL) communications protocol used by the components of the APC framework 120. The manner in which the machine interface 210 performs such translation between the equipment interface-specific communications protocol and the CORBA IDL protocol of the APC framework 120 is well known to those of ordinary skill in the art. Accordingly, the specific translation process between these two formats will not be discussed herein to avoid unnecessarily obscuring the present invention.

The sensor interface 220 couples the add-on sensor 115 to serve as an interface between the add-on sensor 115 and the APC framework 120. The sensor interface 220 provides setup, activation, monitoring, and data collection for the add-on sensor 115. Similar to the machine interface 210, the sensor interface 220 also reformats and restructures the messages between the specific communications protocol utilized by the sensor 115 and the CORBA IDL protocol used by the components of the APC framework 120.

The applications interface 240 supports the integration of third-party tools (e.g., commercial software packages, such as ModelWare, MatLab, and Mathematica, for example) to the APC framework 120. Typically, these third-party tools do not provide the standard CORBA IDL protocol known to the APC framework 120; accordingly, the applications interface 240 provides the necessary translation between the communications protocol utilized by the third-party tool and the CORBA protocol used by the APC framework 120.

In the illustrated embodiment, the third-party tool is the fault detection unit 125 for analyzing the operational data of the processing tool 105 that is supplied via the machine interface 210 and the sensor interface 220. In one embodiment, the fault detection unit 125 includes Model-Ware software for providing fault detection; however, it will be appreciated that other commercially available fault detection software could also be used without departing from the spirit and scope of the present invention.

The plan executor 230 performs control functions based upon the results determined by the fault detection unit 125. When the applications interface 240 receives the results from the fault detection unit 125, it forwards a copy of the results (usually in the form of an alarm signal) to the plan executor 230. Upon inspection of the results, the plan executor 230 will attempt to rectify any fault conditions with the tool 105 in a manner well known to those of ordinary skill in the art. The solution to a fault condition may be for the plan executor 230 to send a control signal to the machine interface 210 to shut down the tool 105 so as to prevent further manufacturing of faulty silicon wafers. The plan executor 230, in addition to shutting down the tool 105, may also apprise a "fab" technician of any potential solutions to rectify the fault condition through an operator interface (not shown), for example.

In a typical operation, the machine interface 210 and the sensor interface 220 usually forward the operational data obtained from the equipment interface 110 and sensor 115, respectively, to the plan executor 230. The plan executor 230 then buffers this operational data until a batch (i.e., wafer-to-wafer or lot-to-lot) is completed by the processing tool 105. When the batch is complete, the plan executor 230 sends the accumulated operational data of the processing tool 105 to the applications interface 240, which then sends the data to the fault detection unit 125. The fault detection unit 125 subsequently analyzes the received data and forwards the results back to the applications interface 240, which then forwards the results to the plan executor 230 for appropriate action.

A drawback with this typical operation, however, is that the results output from the fault detection unit 125 are usually determined after the batch is completed by the processing tool 105. Accordingly, the plan executor 230 cannot take immediate action to rectify the fault condition, and, thus, numerous faulty wafers could be produced as a result of this delay.

Figure 3A:
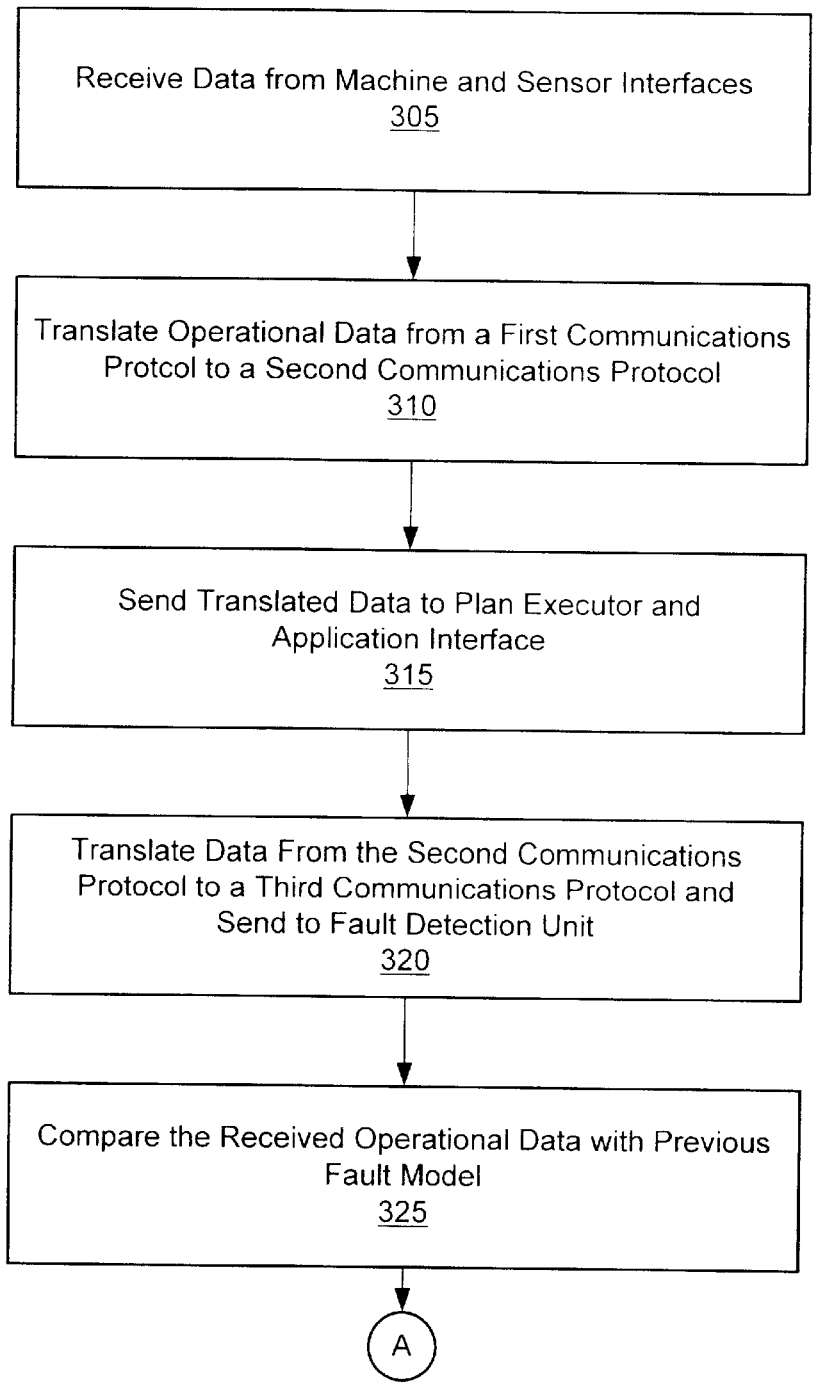
FIGS. 3A and 3B show a process for providing fault detection in near real-time for the manufacturing system of FIG. 1.
Figure 3B:
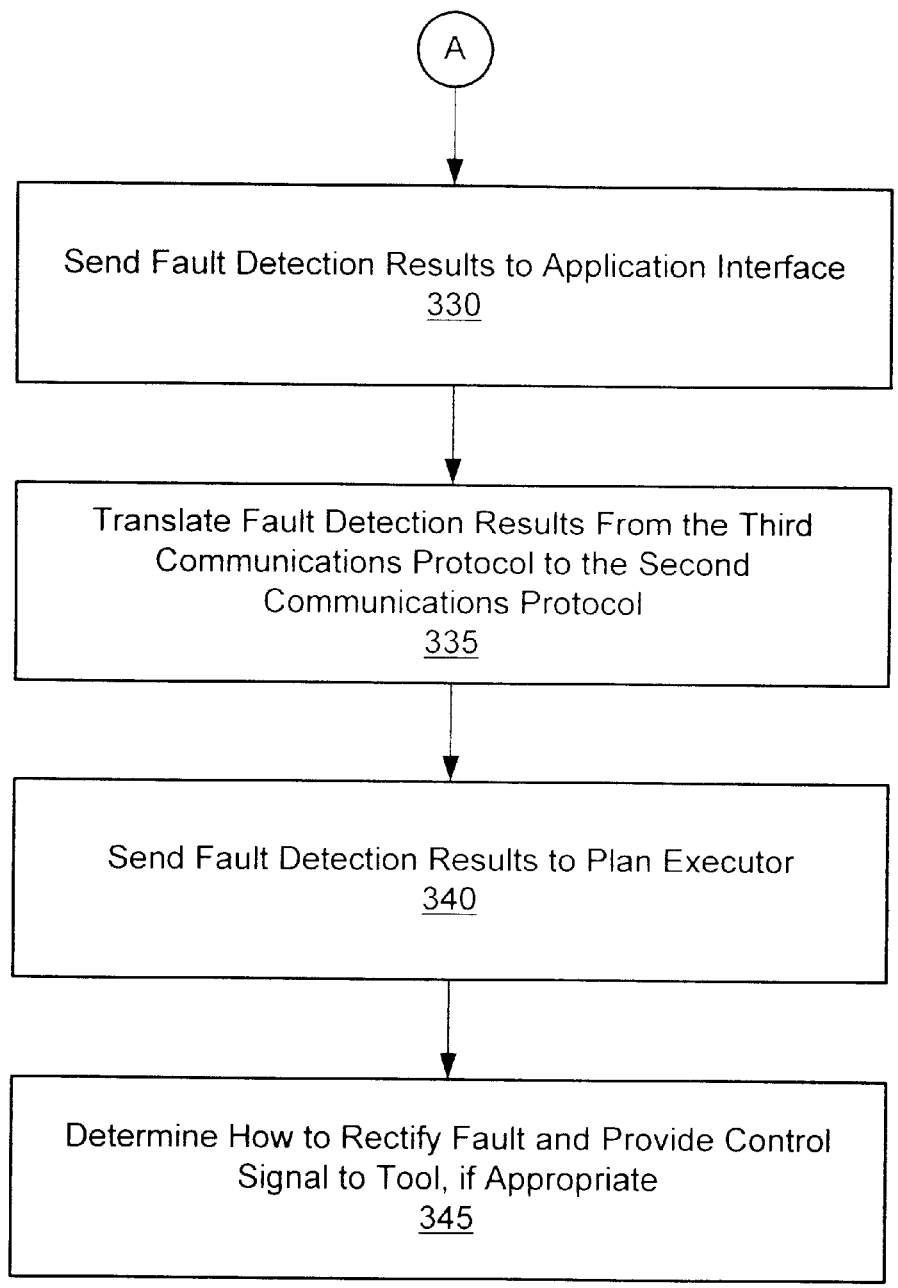

Turning now to FIG. 3, a process 300 for the near real-time integration of fault detection in the APC framework 120 is provided. The process 300 commences at block 305, where the machine interface 210 and the sensor interface 220 receive operational data of the processing tool 105. In accordance with one embodiment, the machine interface 210 receives the operational data from the equipment interface 110, and the sensor interface 220 receives the operational data from the add-on sensor 115. In an alternative embodiment, the sensor 115 could be omitted, if so desired, in which case the operational data would then come solely from the equipment interface 110.

At block 310, the machine and sensor interfaces 210, 220 translate the operational data into a format that is recognizable to the plan executor 230 and application interface 240 of the APC framework 120 in a manner well established in the art. In accordance with one embodiment, this translation involves the reformatting and restructuring of messages between the specific communications protocol used by the equipment interface 110 and sensor 115 and the CORBA IDL protocol of the APC framework 120. Subsequent to receiving this translated data, the machine and sensor interfaces 210, 220 send the data via the data channel 250 to both the plan executor 230 and the applications interface 240 at block 315.

As the applications interface 240 receives the operational data in near real-time, it translates the data into a protocol used by the fault detection unit 125, and subsequently sends the data to the fault detection unit 125 at block 320. As previously discussed, the manner in which the applications interface 240 translates the data into the proper communications protocol is well known to those of ordinary skill in the art, and will differ depending on the particular type of fault detection software used. The fault detection unit 125, after receiving the operational data from the applications interface 240, compares the operational data to a fault model at block 325. As mentioned, the fault model includes operational data from other similar-type tools in which it was previously known that such tools manufactured silicon wafers within acceptable operational limits.

Subsequent to comparing the operational data of the tool 105 to the fault model data, the fault detection unit 125 sends the results of the comparison to the applications interface 240 at block 330. The applications interface 240 then translates the received results from the fault detection unit 125 into the CORBA IDL protocol used by the APC framework 120 at block 335. The applications interface 240 then forwards the results to the plan executor 230 at block 340, which is typically done in the form of an alarm signal. The plan executor 230, after receiving the alarm signal from the application interface 240, determines how to rectify the fault condition of the tool 105 at block 345 (providing that the tool 105 was actually deemed faulty). Rectifying the fault condition by the plan executor 230 may include a control signal being sent to the equipment interface 110 to shut down the tool 105, and to provide instructions to a "fab" technician on how to clear the fault, for example. The process in which the fault detection unit 125 determines how to rectify the fault condition is well within the knowledge of one of ordinary skill in the art. Accordingly, such process will not be discussed herein to avoid unnecessarily obscuring the present invention.

In accordance with the present invention, the operational data of the tool 105 is received in near real-time at the fault detection unit 250 before the batch processed by the tool 105 is complete. Accordingly, in contrast with typical fault reporting techniques, it is more likely that a fault will be cleared prior to the completion of the batch that is currently being processed by the tool 105.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for providing fault detection in a manufacturing process, comprising:

receiving operational data from a processing tool related to the manufacture of a processing piece at a first interface;

sending the operational data from the first interface to a second interface and a process controller as the data is received at the first interface;

sending the operational data from the second interface to a fault detection unit as the data is received at the second interface;

determining if a fault condition exists with the processing tool at the fault detection unit;

sending an alarm signal indicative of the fault condition to the process controller from the second interface providing that the fault condition was determined by the fault detection unit;

performing a predetermined action to rectify the fault condition providing that the alarm signal is received by the process controller from the second interface; and sending a control signal by the process controller to the first interface reflective of the predetermined action.

2. The method of claim 1, further comprising:

receiving operational data at a third interface from the first interface prior to sending the operational data to the second interface.

3. The method of claim 2, further comprising:

translating the operational data at the third interface from a first communications protocol used by the first interface to a second communications protocol used by the third interface.

4. The method of claim 3, further comprising:

translating the operational data at the second interface from the second communications protocol used by the third interface to a third communications protocol used by the fault detection unit.

5. The method of claim 1, further comprising:

receiving additional operational data from a sensor that is coupled to the processing tool at a fourth interface; and sending the additional operational data to the second interface as it is received at the fourth interface.

6. The method of claim 5, further comprising:

translating the operational data at the fourth interface from a first communications protocol used by the sensor to a second communications protocol used by the fourth interface.

7. The method of claim 6, further comprising:

translating the operational data at the second interface from the second communications protocol used by the fourth interface to a third communications protocol used by the fault detection unit.

8. The method of claim 1, wherein determining if a fault condition exists, further comprises:

comparing the operational data received at the second interface to predetermined operational data at the fault detection unit.

9. A system for providing fault detection in a manufacturing process, comprising:

a processing tool adapted to manufacture a processing piece;

a first interface, coupled to the processing tool, the first interface adapted to receive operational data from the processing tool related to the manufacture of the processing piece;

a fault detection unit adapted to determine if a fault condition exists with the processing tool; and a framework adapted to receive the operational data from the first interface, and to send the data to the fault detection unit as the data is received by the first interface;

wherein the framework includes:

a second interface, coupled to the fault detection unit, and adapted to receive the operational data as the data is received by the first interface during the manufacture of the processing piece, and to send the operational data to the fault detection unit as the data is received at the second interface;

a process controller, coupled to the first and second interfaces, the process controller adapted to receive the operational data as the data is received at the first interface during the manufacture of the processing piece;

wherein the second interface is further adapted to send an alarm signal to the process controller providing that a fault condition was determined by the fault detection unit; and wherein the process controller is further adapted to perform a predetermined action to rectify the fault condition providing that the alarm signal is received, and to send a control signal to the first interface reflective of the predetermined action.

10. The system of claim 9, wherein the framework further includes:

a third interface, coupled between the first interface, the process controller, and the second interface, the third interface adapted to receive the operational data from the first interface, and to translate the operational data between a first communications protocol used by the first interface and a second communications protocol used by the framework.

11. The system of claim 10, wherein the second interface is further adapted to translate the received operational data from the second communications protocol used by the framework to a third communications protocol used by the fault detection unit.

12. The system of claim 9, further comprising:

a sensor, coupled to the processing tool, the sensor adapted to receive additional operational data from the processing tool; and wherein the framework further includes:

a fourth interface, coupled between the sensor, the process controller, and the second interface, the fourth interface adapted to receive the operational data from the sensor, and to translate the operational data between a first communications protocol used by the sensor and a second communications protocol used by the framework.

13. The system of claim 9, wherein the fault detection unit is further adapted to compare the operational data of the processing tool to predetermined operational data to determine the presence of the fault condition.

14. The system of claim 9, wherein the processing tool is a semiconductor fabrication tool, and the processing piece is a silicon wafer.

* * * * *